United States Patent [19]

Sugibayashi

[11] Patent Number: 5,285,412
[45] Date of Patent: Feb. 8, 1994

[54] SEMICONDUCTOR MEMORY DEVICE WITH STEP-DOWN TRANSISTOR FOR EXTERNAL SIGNAL

[75] Inventor: Tadahiko Sugibayashi, Tokyo, Japan
[73] Assignee: NEC Corporation, Tokyo, Japan
[21] Appl. No.: 759,294
[22] Filed: Sep. 13, 1991

[30] Foreign Application Priority Data

Sep. 13, 1990 [JP] Japan .................. 2-243085

[51] Int. Cl.⁵ .............................. G11C 11/408
[52] U.S. Cl. .................. 365/189.11; 365/226; 365/233; 307/475
[58] Field of Search .......... 365/189.11, 226, 233; 307/475

[56] References Cited

U.S. PATENT DOCUMENTS

| | | | |
|---|---|---|---|
| 4,216,390 | 8/1980 | Stewart | 307/475 |
| 4,574,273 | 3/1986 | Atsumi et al. | 307/475 |
| 4,616,143 | 10/1986 | Miyamoto | 365/226 |
| 4,820,941 | 4/1989 | Dolby et al. | 365/226 |
| 4,926,070 | 5/1990 | Tanaka et al. | 307/475 |
| 5,084,637 | 1/1992 | Gregor | 307/475 |

*Primary Examiner*—Joseph E. Clawson, Jr.
*Attorney, Agent, or Firm*—Sughrue, Mion, Zinn, Macpeak & Seas

[57] ABSTRACT

A 16 megabit dynamic random access memory device is active with an internal power voltage lower than an external power voltage for preventing extremely thin gate oxide films of the component field effect transistors from damage, a field effect transistor is coupled between an input terminal applied with an external signal as high as the external power voltage and an input logic gate for producing an internal signal as low as the internal power voltage, and the field effect transistor is supplied at the gate electrode with the internal power voltage so that the external signal steps down before reaching the input logic gate.

6 Claims, 4 Drawing Sheets

SEMICONDUCTOR MEMORY DEVICE WITH STEP-DOWN TRANSISTOR FOR EXTERNAL SIGNAL

FIELD OF THE INVENTION

This invention relates to a semiconductor memory device and, more particularly, to an input circuit coupled between an input terminal and an internal component circuit.

DESCRIPTION OF THE RELATED ART

Miniaturization of component circuit elements has increased the integration density of semiconductor memory device, and 4 megabit dynamic random access memory devices are presently available. The 4 megabit dynamic random access memory device is supplied with an external power voltage level of 5 volts from the outside thereof, and the external power voltage level is directly supplied to component circuits of the dynamic random access device. However, the power voltage level of 5 volts is not directly available for a 16 megabit dynamic random access memory device, because extremely thin gate oxide films of the miniature component transistors are liable to be damaged by the external power voltage level. If a low power voltage level is available, the 16 megabit dynamic random access memory device will be free from the damage of the gate oxide films. However, 5 volts is the standard power voltage level for most electronic systems as well as for most of integrated circuit devices, and a lower power voltage level is a rather fantastic idea.

In this situation, it is proposed that a 16 megabit dynamic random access memory device be equipped with a built-in step-down circuit; the built-in step-down circuit allows an electronic system to use the standard power voltage level of 5 volts.

FIG. 1 shows a typical example of an input circuit 1 incorporated in the dynamic random access memory device, and the input circuit 1 is provided in association with a control signal terminal 2 where a row address strobe signal RAS is applied. The input circuit 1 has a first inverting stage 1a implemented by a series combination of a p-channel enhancement type field effect transistor Q1 and an n-channel enhancement type field effect transistor Q2, and the first inverting stage 1a is coupled between an internal power voltage line 3a and a ground line 3b. The internal power voltage on the power voltage line 3a is regulated to about 3.3 volts, and an internal row address strobe signal IRAS swings its voltage level between about 3.3 volts and the ground voltage level. The internal row address strobe signal IRAS is supplied from the input circuit 1 to a controlling unit 4, and the component field effect transistors of the controlling unit 4 need to withstand 3.3 volts. The internal power voltage is produced from an external power voltage level of 5 volts by a built-in step-down circuit 5, and the external power voltage is allowed to fluctuate within 10%. For this reason, the component field effect transistors of the built-in step-down circuit 5 must withstand 5.5 volts. Though not shown in FIG. 1, a selected word line is boosted to 5.5 volts, and the boosted word line allows switching field effect transistors to propagate the voltage level on the associated bit lines to storage capacitors without voltage decay. Therefore, the switching transistors of the memory cells are expected to withstand 5.5 volts.

External signals are lifted to the external power voltage level, and over-shoots tend to take place in the external signals. The component field effect transistors of input circuits need to withstand the over-shoots, and, for this reason, the input circuits are adapted to withstand 6.5 volts. The n-channel enhancement type field effect transistor Q1 has a gate oxide film thick enough to withstand 6.5 volts.

Thus, the component field effect transistors of the 16 megabit dynamic random access memory device operate at various voltage levels; and the gate oxide films differing in thickness make the process sequence complex. If all of the component field effect transistors are designed to withstand the maximum voltage level of 6.5 volts, the process sequence will become simple. However, the gate oxide films thick enough to withstand 6.5 volts enlarge the component field effect transistors, and the integration density is decreased rather than that produced through the complex process sequence. Thus, there is a trade-off between the Miniaturization of the component field effect transistors and the complexity of the process sequence in the prior art ultra large scaled integration.

SUMMARY OF THE INVENTION

It is therefore an important object of the present invention to provide a semiconductor memory device which is fabricated through a simple process sequence without sacrifice of integration density.

To accomplish the object, the present invention proposes to cause an external signal to step down before reaching an associated input circuit.

In accordance with the present invention, there is provided a semiconductor memory device fabricated on a single semiconductor chip, comprising: a) a plurality of input terminals applied with external signals of a first voltage level; b) external signal input means supplied with the external signals and producing internal signals; c) a memory cell array supplied with the internal signals and other internal signals, and memorizing pieces of data information, the memory cell array being operative to produce a read-out data signal; d) a step-down circuit supplied with an external power voltage and producing an internal power voltage smaller in magnitude than the external power voltage; e) a first voltage line supplied with the internal power voltage; and f) a second voltage line supplied with a constant voltage level different from the internal power voltage, the external signal input means comprising b-1) a logic gate coupled between the first and second voltage lines and responsive to one of the external signals supplied to an input node thereof for producing one of the internal signals of a second voltage level smaller in magnitude than the first voltage level, and b-2) a first field effect transistor coupled between one of the plurality of input terminals and an input node of the logic gate, and having a gate electrode coupled to the first voltage line so as to supply the aforesaid one of the external signal decreased in magnitude to the logic gate.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
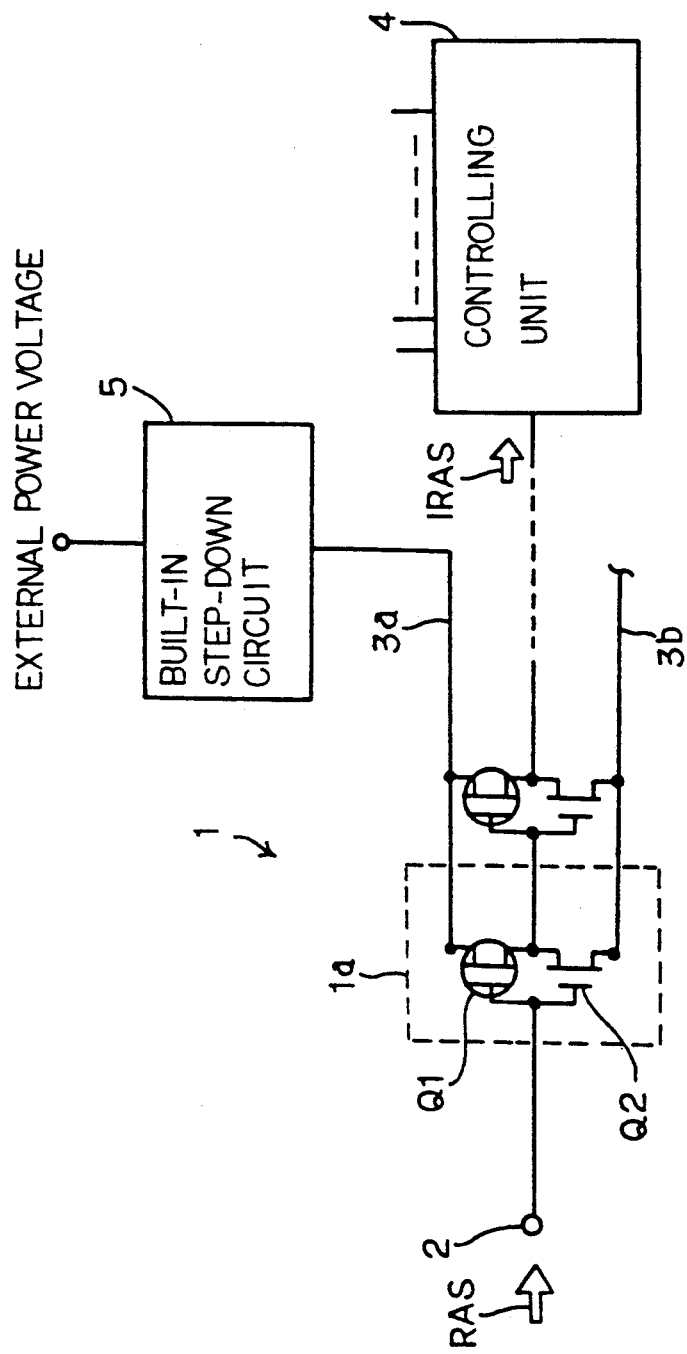
FIG. 1 is a circuit diagram showing the arrangement of the input circuit incorporated in the prior art dynamic random access memory device.
Figure 2:
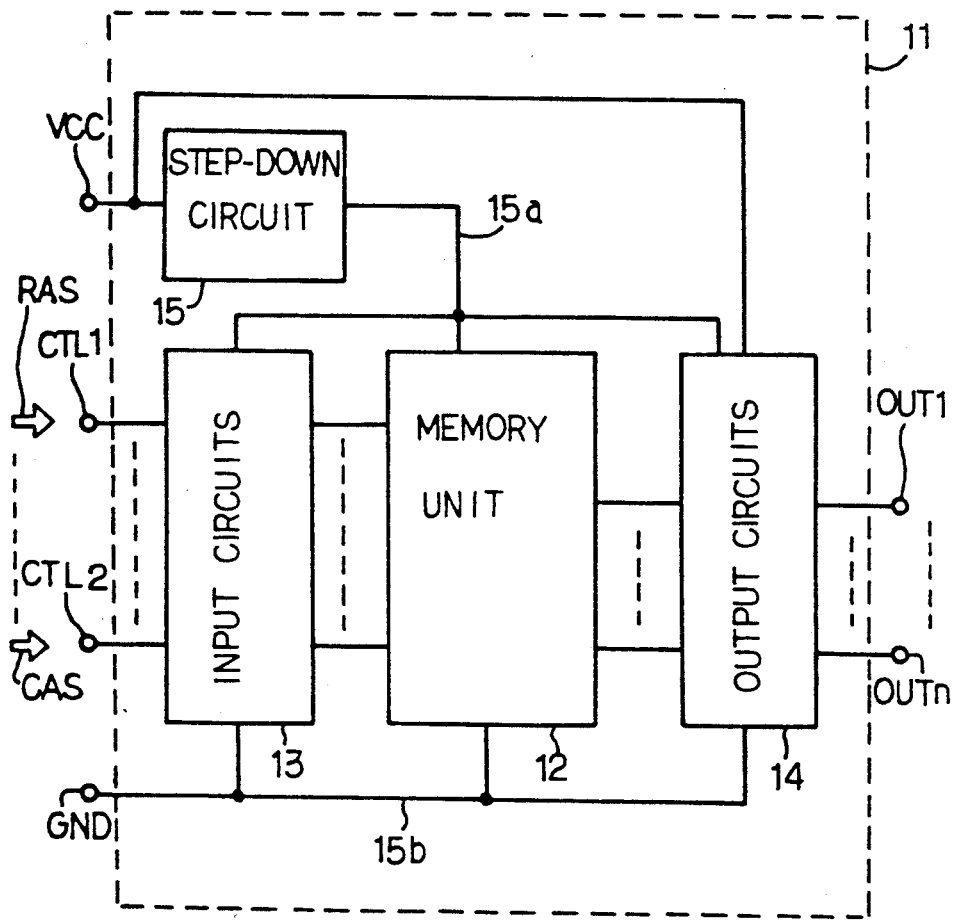
FIG. 2 is a block diagram showing the arrangement of a dynamic random access memory device according to the present invention.
Figure 3:
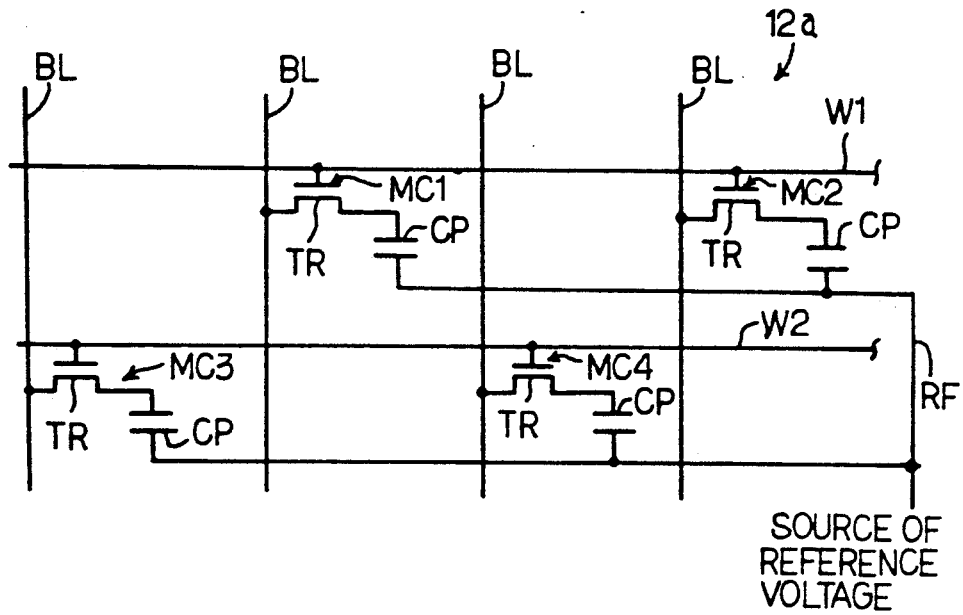
FIG. 3 is a circuit diagram showing the arrangement of a memory cell array incorporated in the dynamic random access memory device shown in FIG. 3.

Referring to FIG. 2 of the drawings, a dynamic random access memory device embodying the present invention is fabricated on a single semiconductor chip 11, and largely comprises a memory unit 12, input circuits 13, output circuits 14 and a step-down circuit 15. Although the memory unit 12 is further supported by other peripheral circuits and units, they are not illustrated in FIG. 2, because they do not directly incorporate the novel features of the present invention. The memory unit 12 has a memory cell array 12a associated with addressing units, data amplifiers and so forth which are controlled by a timing generator. The memory cell array 12a is implemented by a plurality of memory cells arranged in rows and columns, and four of the plurality of memory cells are labeled with MC1, MC2, MC3 and MC4 in FIG. 3. Each of the memory cells MC1 to MC4 is formed by a series combination of a transfer transistor TR and a storage capacitor CP coupled between an associated bit line BL and a reference voltage line RF, and word lines W1 and W2 are coupled with the gate electrodes of the transfer transistors TR in the associated rows. The row addressing unit (not shown) selectively lifts the word lines W1 and W2 to about 5.5 volts, and the transfer transistors TR coupled therewith turn on to conduct the associated bit lines BL to the storage capacitors CP. A data bit in the form of either high or low voltage level is written from the associated bit lines BL to the storage capacitors CP, and is read out from the storage capacitor CP to the associated bit line BL. The dynamic random access memory device shown in FIG. 2 is operable in a nibble mode, and, accordingly, data bits are transferred from the memory unit 12 through the output circuits 14 to output data terminals OUT1 to OUTn.

The data write-in sequence and the data read-out sequence are controlled by the timing generator (not shown), and external controlling signals such as a row address strobe signal RAS and a column address strobe signal CAS are supplied from the outside to controlling terminals CTL1 to CTL2, and the input circuits 13 are respectively provided in association with the controlling terminals CTL1 to CTL2. The input circuits 13 are responsive to the external controlling signals, and produce internal controlling signals. The external controlling signals swing their voltage levels between the ground voltage level and about 5 volts, and over-shoots may take place in the waveforms of the external controlling signals. The internal controlling signals swing their voltage levels to a predetermined voltage level lower than 5 volts, because the gate oxide films of most of the component field effect transistors are extremely thin. For this reason, an external power voltage level Vcc of 5 volts steps down at the built-in step-down circuit 15, and an internal power voltage of about 3.3 volts is distributed through an internal power voltage line 15a to the input circuits 13, the memory unit 12 and the output circuits 14. The ground voltage level is supplied from a ground terminal GND through a ground voltage line 15b to the input circuits 13, the memory unit 12 and the output circuits 14. However, the output data signals swing their voltage levels between 5 volts and the ground voltage level, and, for this reason, the external power voltage Vcc is directly supplied to the output circuits 14.

Figure 4:
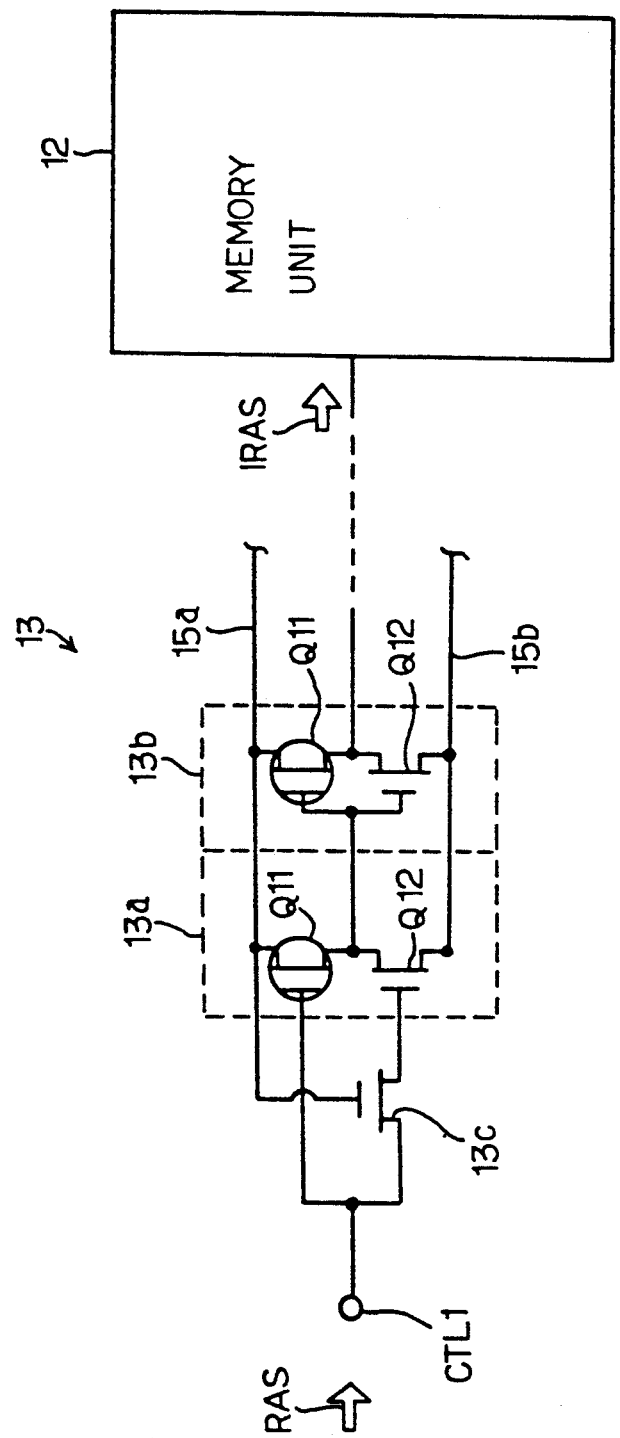
FIG. 4 is a circuit diagram showing the arrangement of an input circuit incorporated in the dynamic random access memory device according to the present invention.

The arrangement of each input circuit 13 is illustrated in FIG. 4, and the input circuit 13 shown in FIG. 4 is assumed to be coupled with the controlling terminal CTL1 for the row address strobe signal RAS. The input circuit 13 comprises a plurality of inverting circuits 13a and 13b coupled in cascade, and a step-down transistor 13c coupled between the controlling terminal CTL1 and the first stage of the cascade combination of the inverting circuits 13a and 13b. In this instance, the inverting circuit 13a serves as a logic gate, and the step-down transistor 13c serves as a first field effect transistor. Each of the inverting circuits 13a and 13b is implemented by a series combination of a p-channel enhancement type field effect transistor Q11 and an n-channel enhancement type field effect transistor Q12 coupled between the internal power voltage line 15a and the ground voltage line 15b, and the step-down transistor 13c is a n-channel enhancement type field effect transistor. The step-down transistor 13c provides a conductive channel between the controlling terminal CTL1 and the gate electrode of the n-channel enhancement type field effect transistor Q12 of the inverting circuit 13a, and the gate electrode of the step-down transistor 13c is coupled with the internal power voltage line 15a. However, the controlling terminal CTL1 is directly coupled with the gate electrode of the p-channel enhancement type field effect transistor Q11 of the inverting circuit 13a, and the output node of each inverting circuit is coupled with the input node of the subsequent stage. The input circuit 13 thus arranged is responsive to the row address strobe signal RAS, and produces an internal row address strobe signal IRAS swinging its voltage level between 3.3 volts and the ground voltage level. Since the threshold level of the step-down transistor 13c is regulated to a predetermined value ranging from 0.5 volt to 1.5 volts, a step-down voltage level ranging between 2.3 volts and 2.8 volts is applied to the gate electrode of the n-channel enhancement type field effect transistor Q12. Although the source node of the n-channel enhancement type field effect transistor Q12 is coupled with the ground voltage line 15b, only the step-down voltage level is applied thereto, and the extremely thin gate oxide film is hardly damaged by an over-shoot produced in the row address strobe signal RAS.

Second Embodiment

Figure 5:
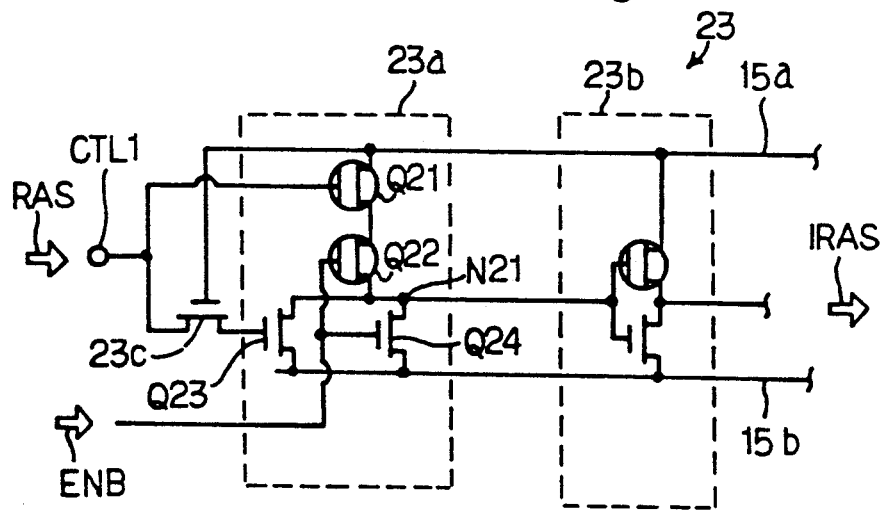
FIG. 5 is a circuit diagram showing the arrangement of another input circuit incorporated in another dynamic random access memory device according to the present invention.

Turning to FIG. 5 of the drawings, an input circuit 23 incorporated in another dynamic random access memory device embodying the present invention comprises a NOR gate 23a followed by an inverting circuit 23b, and the NOR gate 23a has a series combination of p-channel enhancement type field effect transistors Q21 and Q22, an output node N21 and an n-channel enhancement type field effect transistor Q24 coupled between the internal power voltage line 15a and the ground voltage line 15b, and an n-channel enhancement type field effect transistor Q23 coupled between the output node N21 and the ground voltage line 15b. The input circuit 23 is one of a plurality of input circuits corresponding to the input circuits 13, and other component circuits and units are similar to those of the first embodiment. The controlling terminal CTL1 is directly coupled with the gate electrode of the p-channel enhancement type field effect transistor Q21 and with the gate electrode of the n-channel enhancement type field effect transistor Q23 through a step-down transistor 23c implemented by an n-channel enhancement type field effect transistor. An enable signal ENB is supplied to the gate electrode of the p-channel enhancement type field effect transistor Q22 and the gate electrode of the n-channel enhancement type field effect transistor Q24. Since the step-down transistor 23c decreases the voltage level of the row address strobe signal RAS, the gate oxide film of the n-channel enhancement type field effect transistor is hardly damaged.

As will be understood from the foregoing description, the step-down transistor decreases the voltage level of the row address strobe signal RAS, and the gate oxide film of the n-channel enhancement type field effect transistor is as thin as those of the component field effect transistors applied with the internal power voltage. This results in that the input circuits can be fabricated from the p-channel enhancement type field effect transistors and only one kind of the n-channel enhancement type field effect transistors. The field effect transistors with extremely thin gate oxide films allows decreasing the transistor size, and the integration density is surely improved. Moreover, since the external controlling signals are not directly applied to the gate electrodes of the n-channel enhancement type field effect transistors, these n-channel enhancement type field effect transistors have the same gate oxide films, and, for this reason, the fabrication process sequence is relatively simple without sacrifice of the integration density.

Although particular embodiments of the present invention have been shown and described, it will be obvious to those skilled in the art that various changes and modifications may be made without departing from the spirit and scope of the present invention. For example, the present invention is applicable to another type of semiconductor memory device operable with internal signals lower than an external power voltage. The step-down transistors may be provided for all of the input circuits or selectively coupled with the input circuits.

What is claimed is:

1. A semiconductor memory device fabricated on a single semiconductor chip, comprising:
   a) a plurality of input terminals applied with external signals of a first voltage level;
   b) external signal input means supplied with said external signals and producing internal signals;
   c) a memory cell array supplied with said internal signals and other internal signals, and memorizing pieces of data information, said memory cell array being operative to produce a read-out data signal;
   d) a step-down circuit supplied with an external power voltage and producing an internal power voltage smaller in magnitude than said external power voltage;
   e) a first voltage line supplied with said internal power voltage; and
   f) a second voltage line supplied with a constant voltage level different from said internal power voltage;
   wherein said external signal input means further comprises:
   b-1) a logic gate implemented by a NOR gate coupled between said first and second voltage lines and responsive to one of said external signals supplied at an input node thereof for producing one of said internal signals of a second voltage level smaller in magnitude than said first voltage level, and
   b-2) a first field effect transistor coupled between one of said plurality of input terminals and said input node of said logic gate, and having a gate electrode coupled to said first voltage line so as to supply said one of said external signal decreased in magnitude to said logic gate,
   wherein said NOR gate comprises a series combination of a first p-channel enhancement type field effect transistor, a second p-channel enhancement type field effect transistor, an output node of said NOR gate and a third n-channel enhancement type field effect transistor coupled between said first and second voltage lines, and a fourth n-channel enhancement type field effect transistor coupled between said output node of said NOR gate and said second voltage line, and
   wherein said first field effect transistor provides a conductive channel between said one of said input terminals and the gate electrode of said fourth n-channel enhancement type field effect transistor, the gate electrode of said first p-channel enhancement type field effect transistor being directly coupled to said one of said input terminals, an enable signal being supplied to the gate electrode of said second p-channel enhancement type field effect transistor and the gate electrode of said third n-channel enhancement type field effect transistor, said first field effect transistor being of an n-channel type field effect transistor.

2. A signal circuit, comprising:
   a first power line supplied with a first power voltage;
   a second power line supplied with a second power voltage;
   an output node;
   a first transistor of one channel type connected between said first power line and said output node and having a gate;
   a second transistor of an opposite channel type connected between said output node and said second power supply line and having a gate;
   an input terminal supplied with an input signal which takes a first voltage whose absolute value is larger than said first power voltage to indicate a first logic level and a second voltage whose value is approximately equal to said second power voltage to indicate a second logic level;
   a third transistor of said opposite channel type connected between said input terminal and the gate of said second transistor and having a gate connected to said first power line to transfer said input signal to the gate of said second transistor while changing said input signal from said first voltage to a lower voltage; and transferring means coupled between the gate of said first transistor and said input terminal for transferring said input signal to the gate of said first transistor without changing said input signal of said first voltage.

3. The signal input circuit as claimed in claim 2, wherein said transferring means comprises a conductive wiring connected between the gate of said first transistor and said input terminal.

4. The signal input circuit as claimed in claim 3, wherein said signal input circuit is employed as a signal input circuit of a semiconductor memory device.

5. A signal input circuit comprising:
a power line supplied with a power voltage;
a ground line supplied with a ground voltage;
an output node;
a P-channel transistor connected between said power line and said output node and having a gate;
a first N-channel transistor connected between said output node and said ground line and having a gate;
an input terminal supplied with a logic signal having at least one of a high level represented by a voltage higher than said power voltage and a low level represented by said ground voltage; and
a second N-channel transistor connected between said input terminal and the gate of said first N-channel transistor and having a gate connected to said power line, the gate of said P-channel transistor being connected to said input terminal to receive said logic signal without intervention of said second N-channel transistor.

6. The signal input circuit as claimed in claim 5, wherein said signal input circuit is employed as a signal input circuit of a semiconductor memory device.

* * * * *